Figure 1:
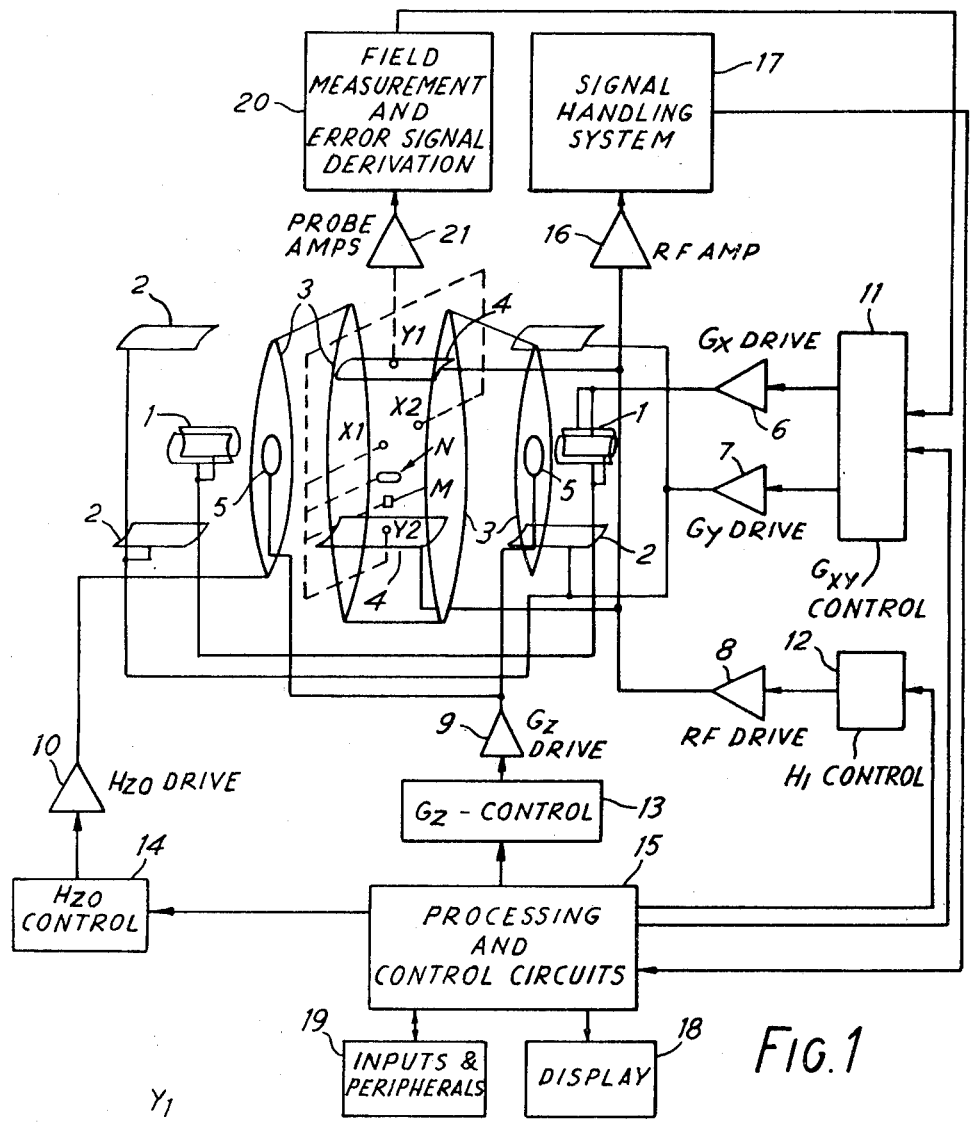

United States Patent [19]

Burl et al.

[11] 4,284,950
[45] Aug. 18, 1981

[54] IMAGING SYSTEMS

[75] Inventors: Michael Burl, Iver; Hugh Clow, Reading; Colin G. Harrison, High Wycombe; Ian R. Young, Sunbury-on-Thames, all of England

[73] Assignee: E M I Limited, Hayes, England

[21] Appl. No.: 48,777

[22] Filed: Jun. 15, 1979

[30] Foreign Application Priority Data

Aug. 5, 1978 [GB] United Kingdom ............... 32386/78

[51] Int. Cl.³ ............................................ G01N 27/00
[52] U.S. Cl. .................................... 324/320; 324/313
[58] Field of Search ................................ 324/320, 313

[56] References Cited
U.S. PATENT DOCUMENTS 3,443,209   5/1969   Nelson et al. ........................ 324/320

3,622,869   11/1971   Golay .................................... 324/320

Primary Examiner—Michael J. Tokar
Attorney, Agent, or Firm—Fleit & Jacobson

[57] ABSTRACT

In a medical NMR apparatus it is desirable that the axial magnetic field, Ho, is uniform. The result can in theory be obtained by accuracy of construction but in practice this cannot readily be achieved. It is now proposed to use a field sensing probe system which indicates the value of that field at a plurality of positions in the examined region and provides error signals indicating deviations from uniformity. The field is automatically corrected in response to the error signals by applying currents to field correcting coils. The errors may be considered as distinct gradient and dishing errors which are corrected individually.

10 Claims, 13 Drawing Figures

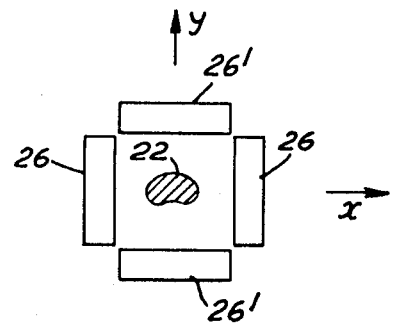
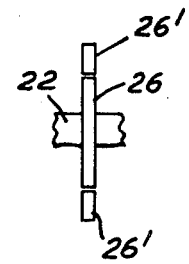
FIG.5a    FIG.5b
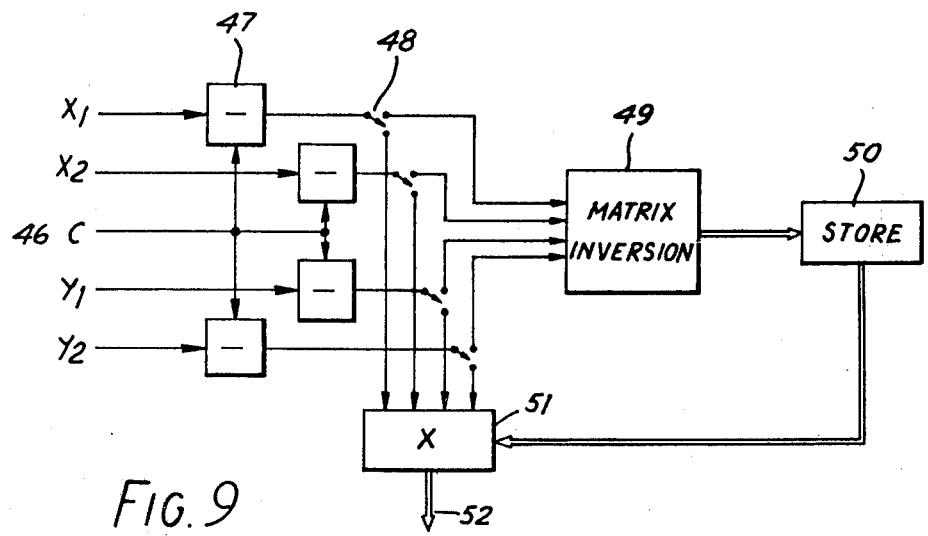
FIG.9

IMAGING SYSTEMS

The present invention relates to systems for providing images of distributions or a quantity, in a chosen region of a body, by gyromagnetic resonance, particularly nuclear magnetic resonance (NMR) techniques. Such techniques may be used for examining bodies of different kinds. However a particularly beneficial application is the examination of patients for medical purposes.

It has been proposed that nuclear magnetic resonance be used to provide distributions of water protons or other molecules or relaxation time constants in sectional slices of volumes of patients. It is particularly beneficial to perform the examination to provide data which can be analysed by techniques similar to those known for distributions of x-ray attenuation provided by computerised tomography systems.

An apparatus for and method of achieving this, and improvements thereto, have been described and claimed in our co-pending United States patent applications Nos. 041,424, 039650, 040289 and 039649. In this arrangement a steady axial magnetic field which can be labelled $H_{zo}$, is applied during the examination. This combines with various gradient fields to cause resonance in selected regions of the body. It is important that, during the relevant parts of the examination sequence and in the parts of the body to be examined, this $H_{zo}$ field is maintained as uniform as possible. It has been suggested that care be taken to maintain a high degree of uniformity, for example by accurate construction of field coils and by the reduction of metal parts of the apparatus. It is not always possible however, to achieve a sufficiently good uniformity. It is an object of this invention to provide an arrangement for which a more uniform $H_{zo}$ field can be provided.

According to the invention there is provided an apparatus for examining a body by means of gyromagnetic resonance, for example nuclear magnetic resonance, including a coil system arranged to provide a substantially uniform magnetic field in a direction parallel to a chosen axis in the body, probe means for providing signals indicative of values of the magnetic field at a plurality of positions in a region including a part to be examined of said body, means for determining, from said signals, deviations from uniformity of said magnetic field in the region and correction means responsive to said determinations for reducing said deviations from uniformity.

Figure 2:
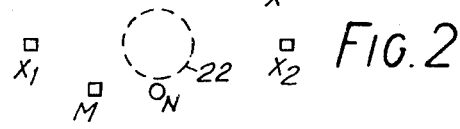
Figure 3:
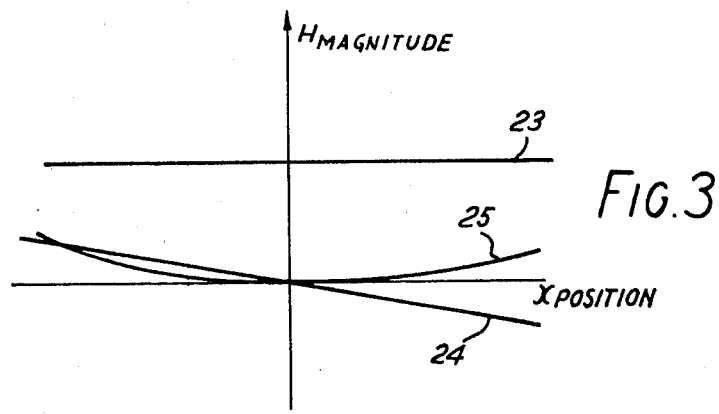
Figure 4A:
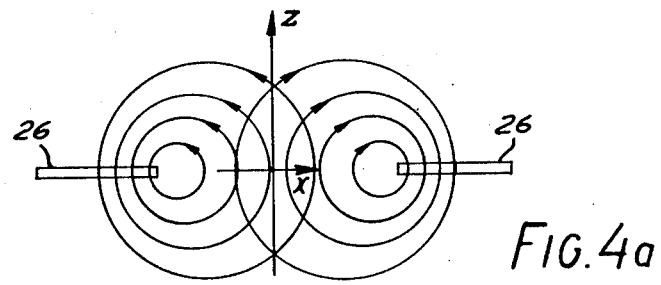
Figure 4B:
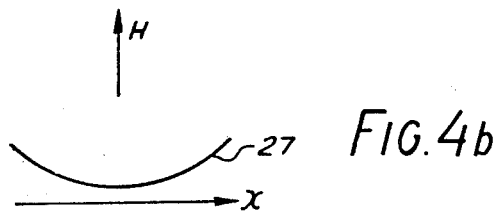
Figure 7:
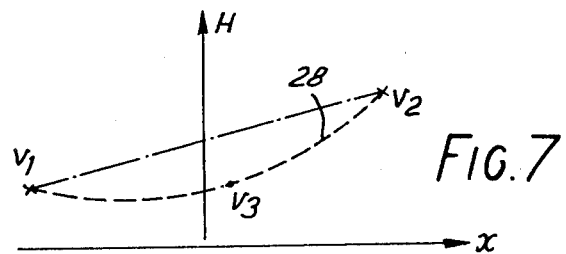
Figure 6A:
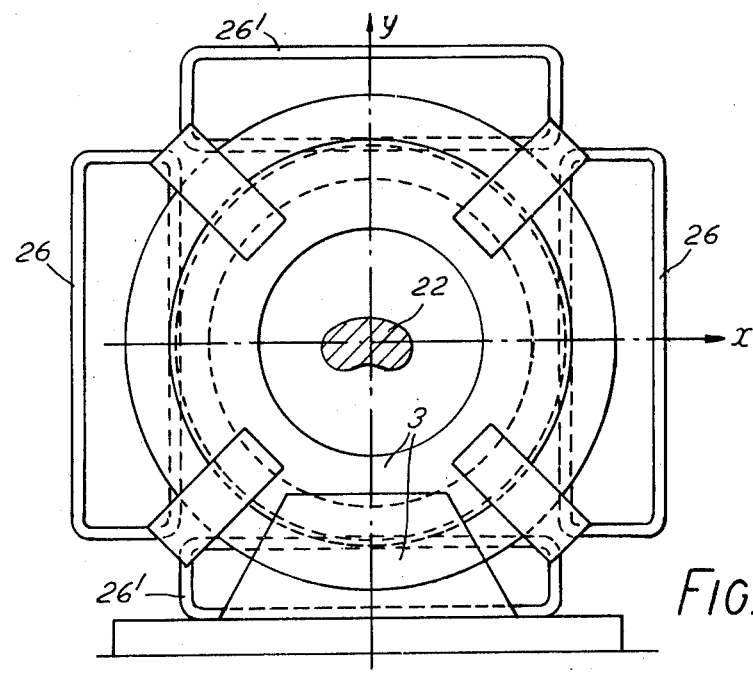
Figure 6B:
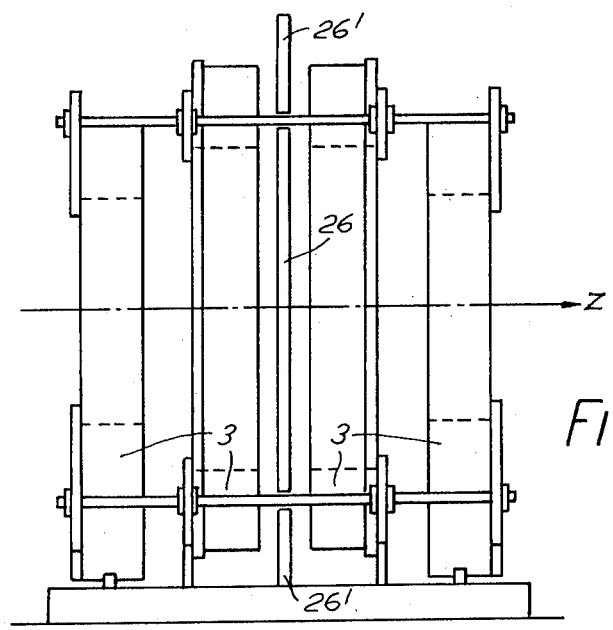
Figure 6C:
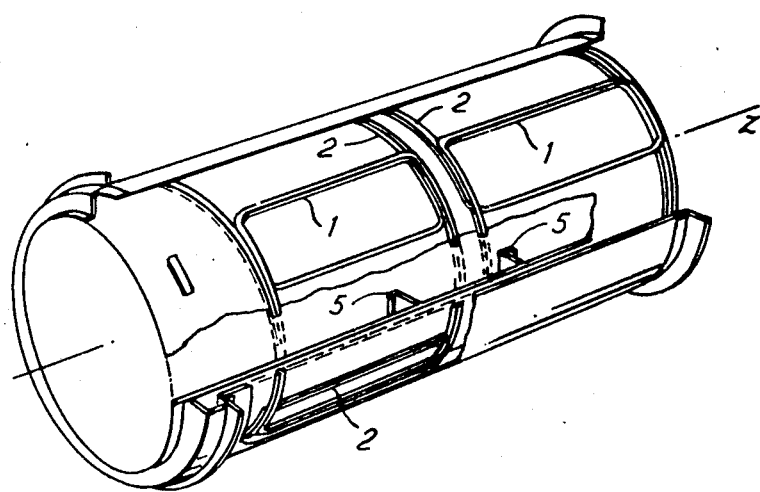
Figure 8:
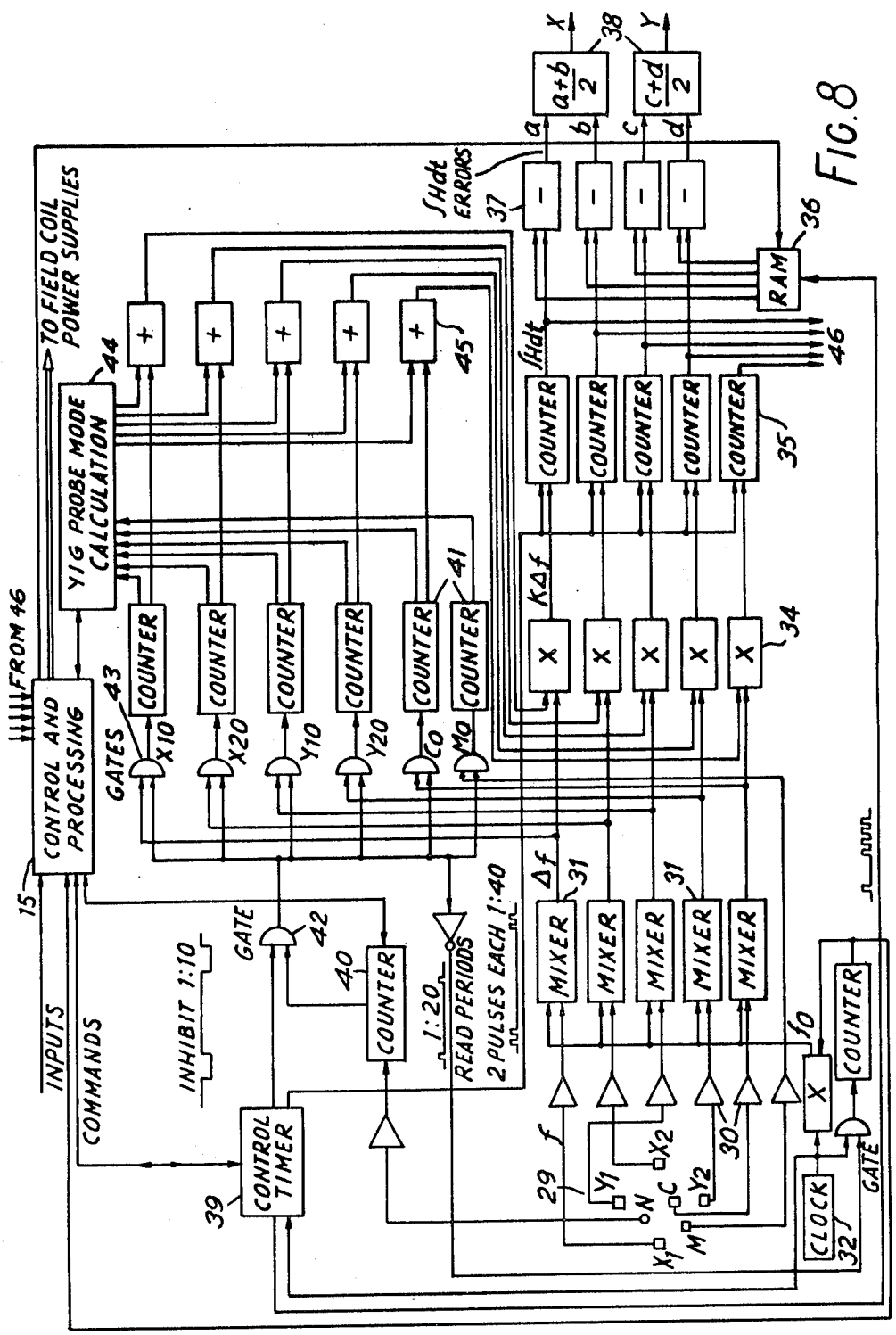

In order that the invention may be clearly understood and readily carried into effect it will now be described, by way of example, with reference to the accompanying drawings, of which:

FIG. 1 shows in schematic form an NMR apparatus with which the invention may be used, FIG. 2 shows the disposition of field measurement probes in the spparatus of FIG. 1, FIG. 3 shows the nature of field errors to be corrected, FIGS. 4a and 4b show how a disposition of field coils can correct one of the field errors, FIGS. 5a and 5b show how these coils are disposed in practice, FIGS. 6a, 6b and 6c show a set of NMR coils including those for correcting field errors, FIG. 7 shows how the errors may be evaluated, FIG. 8 shows a probe signal processing circuit for an NMR apparatus, arranged to determine field errors, and FIG. 9 shows how the signals are processed to provide corrections for the field errors.

Nuclear magnetic resonance techniques are generally used to analyse distributions of protons of water molecules in a body. They can, however, be used to analyse other molecules.

Molecules subject to a magnetic field have a resonant frequency related to the value of the field. Then by application of an RF magnetic field at the resonant frequency they can be excited and the excitation allowed to decay. The decay causes an induced signal at the resonant frequency in suitable coils around the body.

In the arrangement described in the aforesaid applications the magnetic field is adjusted to have different values in different parts of the body. Only those parts having a resonant frequency equal to the frequency of the RF field are excited.

The basic magnetic field $H_{zo}$ is in the z direction, usually co-axial with a patients body (all fields in that direction being referred to as Hz). A further Hz field is applied to have a gradient Gz in the z direction so that $G_a = \delta Hz/\delta z$. This provides a unique total field value in a chosen cross-sectional slice of the patient. A periodic Rf field $H_1$, of frequency chosen to cause resonance in the selected slice is then applied. Thus only the molecules in the slice resonate. The resonance signal from the slice can then be detected. However as it is detected there is applied a further field gradient $G_R = \delta Hz/\delta r$ where the field is in the z-direction but the gradient is in a direction r perpendicular to z. This causes frequency dispersion of the resonant frequencies in the r-direction and consequent frequency dispersion of the resonance signal detected. Frequency analysis of this signal, preferably by Fourier Transformation, yields a plurality of resonance signals each for a different one of a plurality of strips in the chosen slice perpendicular to r.

Now for analysis by x-ray techniques this procedure is repeated for many different directions of r to provide a plurality of sets of signals for sets of strips in different directions.

In practice $G_R$ is provided as the sum of Gx ($=\delta Hz/\delta x$) and Gy ($=\delta Hz/\delta y$) field gradients, where x, y and z are orthogonal directions, and the relative magnitudes of these components are varied to change the direction of r.

FIG. 1 shows in simplified form the NMR apparatus described in the said applications. Illustrated, schematically only, are coils 1, which provide the Gx component of $G_R$, 2, which provide the Gy component of $G_R$, 3, which provide the steady $H_{zo}$ field, 4, which provide the periodic H1 (RF) field, and 5, which provide the $G_z$ field gradient. The coils are driven by Gx, Gy, RF ($H_1$), $G_z$ and $H_{zo}$ drive amplifiers 6, 7, 8, 9 and 10 respectively, controlled by $G_{xy}(G_R)$, $H_1$, $G_z$ and $H_{zo}$ control circuits 11, 12, 13 and 14 respectively. These circuits can take suitable forms which will be well known to those with experience of NMR equipment and other apparatus using coil induced magnetic fields. The circuits are controlled by a central processing and control unit 15 to achieve a desired pulse sequence.

The signal sensed, during the $G_R$ field application, is received in this example by the $H_1$ coils 4 and is amplified by an RF amplifier 16 before being applied to signal handling circuits 17. In certain circumstances it may be preferable to provide separate coils specifically designed for the purpose, to sense the signal. The circuits 17 are arranged to make any appropriate calibrations and corrections but essentially transmit the signals, which are effectively proton density values for strips in the body, to the processing circuits to provide the required representation of the examined slice. These circuits can be specially designed to implement the CT type processing as described and claimed in U.S. Pat. No. 3,924,129. It is, however, advantageous to implement the processing by a suitably programmed digital computer. This computer can also conveniently control the pulse sequence and thus represents the circuits indicated at 15. The picture thus obtained is viewed on a display 18, such as a television monitor, and this may include inputs and other peripherals 19 for the provision of commands and instructions to the machine, or other forms of output.

The apparatus also includes field measurement and error signal circuits 20 which receive signals via amplifiers 21 from field probes $X_1$, $X_2$, $Y_1$, $Y_2$, N and M shown. The positions of the probes, in relation to the examined slice of the body 22 of the patient, are further shown in FIG. 2. $X_1$, $X_2$, $Y_1$ and $Y_2$ are in this example conventional YIG (yttrium-iron-garnet) tuned oscillator field measuring probes. These probes give measures of the fields at the points at which they are situated as oscillations with frequency proportional to the field intensity. The values measured are therefore obtained by a count of the oscillations in a set time. In practice the YIG probes can oscillate in different modes and it is necessary to determine the mode in operation. For this purpose there are provided NMR probes M & N. These probes are simply miniature cells of pure water (such as a closed test tube) surrounded by a small coil. Preferably the water is doped to have a suitable value of T, relaxation time-constant. The probes give a reliable resonance of 4.26 kHz/Oe and can be used to check the YIG tuned oscillator modes. Probe N, fixed in space, acts as a reference. A movable NMR probe M may be moved adjacent the YIG probes in turn to provide data to determine their modes of oscillation, orientation and other characteristics. Other types of probe may be used as desired.

The apparatus so far described is essentially that disclosed in the said co-pending applications. This invention is particularly concerned with uniformity of the steady magnetic field $H_{zo}$. The planar slice, of the patient, which is to be examined is perpendicular to the direction (z) of this field and it is desired to obtain a uniformity of a few parts per million over a diameter of about 300 cm. The uniformity should be sustained for relatively long periods, typically half an hour. It is therefore proposed to detect non-uniformities of the field to second order non-uniformities in the said plane and to automatically correct for them.

First and second order non-uniformities of the $H_{zo}$ field are respectively gradient fields and so-called "dishing" fields. The nature of these fields is shown in FIG. 3 which shows the $H_z$ field magnitude as a function of position in the x direction in the slice plane. Shown, not to scale, are a uniform field 23, a field gradient 24 and a dishing field 25. In practice the actual field is a sum of fields such as these. In a similar manner to that in which the $G_R$ field gradient is provided by Gx and Gy components, the gradient and dishing components of the field are resolved into x and y components and are corrected by fields applied by appropriate coils.

It will be apparent that the gradients are of the same form as those deliberately applied and may be corrected by coils similar to 1 and 2 or by additional currents on the same coils. Different coils are preferred but they should be placed alongside the coils 1 and 2 in substantially the same position and the same orientation. Of course other correction coil types may be used.

The dishing errors are corrected by pairs of rectangular coils, such as those shown at 26 in FIG. 4a. These coils combine to provide the dished field, shown at 27 in FIG. 4b, which can be used to correct an opposing dishing error in the main field.

FIGS. 5a and 5b show, in end and side elevation respectively, the disposition, in relation to the patient's body 22, of two pairs of coils 26 and 26', for correcting dishing errors in orthogonal directions x and y in the plane of the slice.

FIGS. 6a and 6b show respectively the same views as FIGS. 5a and 5b in more detail and in relation to the $H_{zo}$ coils, 3. FIG. 6c shows the Gx coils 1 and Gy coils 2, both of which are two pairs of saddle shaped coils wound on a former inserted into coils 3. Also shown are the $G_z$ coils 5, these and the $H_1$ coils, not shown, being essentially as described in the said co-pending applications although they can take other known forms if desired. As mentioned hereinbefore the correction coils for the x and y gradient errors are of substantially the same form and disposition as the coils 1 and 2 used to set up the Gx and Gy gradient fields and may be the same coils. They are not shown separately from coils 1 and 2 in FIGS. 6a and 6b.

The errors present in one direction can be determined from at least three spot measurements of the magnetic field. FIG. 7 shows a field, indicated by the broken line 28, which is detected by three samples V1, V2 and V3. These could be provided respectively by the probes $X_1$, $X_2$ and N in FIG. 2. The field can be considered to result from a gradient field (chain dotted line) component and a dished field component. The gradient component can be readily determined from the two values $V_1$ and $V_2$ and the addition of $V_3$ indicates the dishing. Detection of field errors beyond second order will require the use of additional probes.

Field measurement for the detection of these errors is provided by five YIG probes. These are the four probes $X_1$, $X_2$, $Y_1$ and $Y_2$ shown in FIG. 2 plus an extra and substantially identical probe C which should be at the centre of the coil arrangement. For practical reasons it is not possible for probe C to be at the centre but an offset can in practice be tolerated without undue error. The probe C can be calibrated in the same manner as the other YIG probes, using the NMR probes N and M.

When the YIG probes have been individually calibrated they can be used to detect field errors and the gradient and dishing correction coils used to reduce the errors. One suitable method of operation is to set the main coils to give the desired value of $H_{zo}$ at probe C, to detect deviations from the desired value of the other probes and to use the correction coils to reduce those deviations.

To achieve this eficiently it is desirable to calibrate the correction coils so as to evaluate the changes which can be effected at the probe positions by unit current in each coil. The calibration of these coils is carried out in the presence of the $H_{zo}$ field. The procedure is as follows. First the field produced per unit current in one coil is measured at each of the probes $X_1$, $X_2$, $Y_1$ and $Y_2$ and that is repeated for each coil system (horizontal dishing, vertical dishing, horizontal gradient and vertical gradient). The field is measured as the frequency change produced $$\Delta F_i = F_{ij} I_j \text{ PS}$$

where i indicates the probe, i=1-4
j indicates the coil system, j=1-4 and I is unit current.

The changes produced by each coil system at the centre probe C are subtracted from those at the other four probes to provide a 4×4 matrix of field sensitivities.

$$f_{ij} = F_{ij} - F_{oj} \text{ (where O indicates the centre probe C)}$$

Thus $$\Delta f_i = f_{ij} I_j$$

The matrix is then inverted to complete the calibration $$f_{ji} = (f_{ij})^{-1} = \frac{|f_{ij}|}{|f|}$$

Where $|f_{ij}|$ is a co-factor of $f_{ij}$

It should be noted that this procedure is a particularly beneficial calibration since matrix inversion can be achieved by a widely available standard software package for a digital computer. This means that the operation can conveniently be carried out by the central control circuit 15, although of course special purpose circuits could readily be substituted.

Now when actual field errors in operation are measured they are determined as field differences between each of the four probes and the centre probe. This gives an error vector ($\Delta f_i$) in the plane of examination, which is merely multiplied by the inverted sensitivity matrix $f'_{ji}$ to give directly a vector of the current changes required in the four coil systems to correct the errors.

$$I_j = f_{ji} \Delta f_i$$

The appropriate currents are then applied to the correction coils.

In a practical system the YIG tuned oscillators can be connected via counters to a controlling computer which holds the predetermined inverse matrix. The computer can then directly control the field coil power supplies to correct errors as they are detected.

There is shown in FIG. 8 a block diagram of the control system of an NMR machine, substantially as described in the said co-pending applications but including modifications to achieve the $H_{zo}$ field correction of this invention.

The probe system shown at 29 is essentially that shown in FIGS. 1 and 2. Each probe supplies its output to a respective probe amplifier 30. The YIG probe signals at frequency f (2.8 G Hz for a 1 kOe field), are mixed in mixers 31 to bring them to suitable frequencies for mounting. Conveniently $f_o$ is chosen so that $\Delta f = f - f_o$ is in the range 150-200 M Hz. The signal at $f_o$ is provided from the system clock 32, which is a crystal reference clock, via a multiplier 33.

The signals at frequency $\Delta f$ on each channel are multiplied by a factor k in multipliers 34. The factor k may include many different corrections as desired. However the most significant error is that the YIG probes can oscillate in different modes. The factor k is determined to correct for the respective oscillation mode and to produce a signal of frequency which properly represents the field measured. The frequency $k\Delta f$ is counted in counters 35, over a suitable period, to yield $\int H dt$.

One correction which the circuit is intended to apply is for errors in $G_x$ and $G_y$ pulses which are components of $G_R$. These are detected as differences between precalculated values held in a RAM (random access memory) 36 and the measured values during the pulses. In a practical machine the central computer, comprising processing and control 15, is programmed to calculate the required values and they are loaded into RAM 36 from 15. The field errors are then provided by taking the differences in subtractors 37. These differences are calculated for each probe and averaged in units 38 to give X and Y error signals. The field correction is by injection into the field coils of currents proportional to X and Y.

Counting in counters 33 is for periods set by the timing control unit 36. This unit takes the output of the systems clock 32 and forms control pulses as instructed by the system control 15. A required counting period for the YIG probes can be determined from their characteristics. Typically the counting signals are two pulses each 1:40 ratio and closely spaced.

Correction for the different modes of the YIG probes is by use of the NMR probe N with the moving probe M. In an initial procedure before examination begins, counter 40 counts the NMR probe N output with only the $H_{zo}$ field present. As shown this period is set by control 15 but it could be set by timer 39. One YIG probe is calibrated at one time by moving M adjacent to it so that it experiences the same field as closely as possible. Then, one probe at a time in the same period, the counts of the other probes are taken and held in counters/staticisers 41. These are set to the same counting period as counter 40 via gates 42 and 43 which set a window of the NMR probe count. The counts from 41 and 40, the latter via unit 15, are passed to a correction unit 44. This unit determines corrections to be added at 45 to the counter in 41 to give factor k which corrects the YIG probe count to the NMR count. The factor k is a simple correction so that $k\Delta f$ is the count the NMR probe would have given for the same field.

The apparatus of FIG. 8 as described so far is the same as that disclosed in the said co-pending applications. To implement the present invention there is included an extra YIG probe C which, as described hereinbefore, is placed as close as possible to a central position in the coil system. This probe feeds a channel from an amplifier 30 to a counter 35, including the probe mode calibration, exactly as for the other YIG probes. It is not used, as the other probes are, for field pulse error determination but the output of its counter 36, together with the output of the other counters 35, is provided at 46 for correction of $H_{zo}$ field errors as described.

FIG. 9 shows in diagrammatic form the use of the five YIG probe outputs provided at 46. Subtractors 47 subtract the centre reading from the other readings to provide the matrix of field sensitivities. These are directed via switches 48 which, for the calibration signals are set by control to provide the components of the matrix to inversion circuits 49. This can be a wired circuit or can be a microprocessor or other computer programmed in standard manner to provide the inversion. The inverted matrix is held in a store 50.

For working use the switches 48 provide the signals to a multiplier 51 which multiplies them by the stored inverted matrix to give error signals at 52 for the field coils.

It has been explained that these procedures can use standard computer programs. In a practical machine the signals at 46 are provided to the control unit 15 which performs the operations herein explained and directly controls the field coils. This arrangement has been shown in FIG. 8.

As described so far the invention is suitable to correct field errors in a single phase, which is the plane of examination, using five probes disposed in the plane, although field errors will also be reduced outside that plane.

It has been proposed that NMR examination may be applied to volumes of patients as an alternative to use for planar sections. In that event field uniformity over a larger volume is required. This invention may, however, be used to provide such uniformity by duplicating the five sensing probes in each of a plurality of parallel planar sections, typically three sections, and applying the corrections determined for each plane to a plurality of correction coils. Accuracy of correction may, of course, be achieved by increasing the number of planes for which correction is made and reducing their spacing but three is considered to be sufficient for most purposes.

It will be understood that further probes can be used in each planar section if higher order corrections are required, together with extra coils, and that is merely a straightforward extension of the version described.

Volume correction is not necessarily confined to two dimensional correction in a plurality of planes but may be applied three-dimensionally extending the principles of correction discussed hereinbefore to correction on a third, orthogonal, axis. In an example correcting to fourth order on three axes, more than 128 probes may be employed but such correction is generally more precise than is required for practical purposes.

It will be appreciated that alternative forms of this system may be devised to measure field errors in $H_{zo}$ and directly control the field to restore or maintain uniformity.

In NMR apparatus as described the signal to noise ratio of the detected signal can be shown to be proportional to $H_{zo} 3/2$. Thus one way to improve the signal to noise ratio is to increase $H_{zo}$. However this greatly increases the power dissipation. Typically a field of 1 KOe at 40–50 cm usable radius dissipates 15 kw while $3kO_e$ (which improves the signal to noise ratio by a factor of 5.2) at 70 cm usable radius dissipates 120 kW.

It has been stated that the field $H_{zo}$ is a steady magnetic field and it should be so when the examination is taking place. However it is proposed that the $H_{zo}$ may be pulsed; provided it is on while data is being detected it can be off when not needed thus allowing the higher fields to be used while keeping down the total power consumption.

It will be apparent that pulsing the $H_{zo}$ field increase problems of non-uniformity in the field, thus making the field error correction explained hereinbefore even more important.

What we claim is:

1. A medical nuclear magnetic resonance imaging apparatus for providing a nuclear magnetic resonance image of a cross-sectional part of the body of a patient, the apparatus including a coil system arranged to provide a substantially uniform magnetic field in a direction parallel to a chosen axis in the patient's body, probe means for providing signals indicative of values of the magnetic field at a plurality of positions in a region including the part to be imaged, means for determining, from said signals, deviations from uniformity of said magnetic field in the region and correction means responsive to said determinations for reducing said deviations from uniformity.

2. An apparatus according to claim 1 wherein the means for deviating includes means for measuring distinguishable gradient and dishing errors in the magnetic field and the correction means includes means for reducing the gradient and dishing errors separately.

3. An apparatus according to claim 1 or claim 2 in which the probe means are disposed to measure the magnetic field in one or more planes intersecting said region and the correction means are adapted to reduce errors in the planes individually.

4. An apparatus according to claim 3 in which the probe means comprise at least five field measuring probes in each plane.

5. An apparatus according to claim 4 in which one field measuring probe is disposed substantially centrally to said region in each plane.

6. An apparatus according to claim 1 in which the correction means includes a plurality of coils adapted to provide correcting field components and means for combining the measured deviations from uniformity with an inverted matrix of field contributions by predetermined currents in the correcting coils to determine the currents in said coils required to reduce said deviations.

7. A method of reducing deviations from uniformity of a substantially uniform magnetic field produced in a nuclear magnetic resonance apparatus for producing an image of a cross-sectional part of the body of a patient, the method including: measuring values of the magnetic field at a plurality of positions in a region including the part to be imaged; determining, from the measurements, deviations from uniformity of said field; and reducing the deviations in response to the determination.

8. A method according to claim 7 in which the measurements are made at a plurality of positions in one or more planes intersecting the region.

9. A method according to either of claims 7 or 8 including determining the contributions to the field at each of said positions by predetermined current in each of a plurality of coils, combining the contribution at each measuring point with the deviation at that point to control currents in the said coils to tend to reduce said deviation.

10. A method according to claim 9 in which, for each measuring point, a matrix of field contributions from the said coils is constructed and the inverse of said matrix is multiplied by the field deviations to provide the currents required in said coils to reduce deviations.

* * * * *